United States Patent
Abeles et al.

(10) Patent No.: US 8,675,704 B2
(45) Date of Patent: Mar. 18, 2014

(54) SINGLE RIDGE N-P-N DIODE LASER

(75) Inventors: Joseph Hy Abeles, East Brunswick, NJ (US); Zane Alan Shellenbarger, Pennington, NJ (US); Winston Kong Chan, Princeton, NJ (US); Alan Michael Braun, Lawrence Township, NJ (US)

(73) Assignee: SRI International, Menlo Park, CA (US)

( * ) Notice: Subject to any disclaimer, the term of this patent is extended or adjusted under 35 U.S.C. 154(b) by 278 days.

(21) Appl. No.: 13/098,248

(22) Filed: Apr. 29, 2011

(65) Prior Publication Data

US 2011/0274130 A1 Nov. 10, 2011

Related U.S. Application Data

(60) Provisional application No. 61/329,286, filed on Apr. 29, 2010.

(51) Int. Cl.
*H01S 5/026* (2006.01)
*H01S 5/323* (2006.01)

(52) U.S. Cl.
USPC .................................... 372/50.1

(58) Field of Classification Search
USPC ............................ 372/45.01, 50.1
See application file for complete search history.

(56) References Cited

U.S. PATENT DOCUMENTS

| | | | |
|---|---|---|---|
| 7,477,670 B2* | 1/2009 | Abeles et al. | 372/50.12 |
| 7,511,311 B2* | 3/2009 | Kususe et al. | 257/95 |
| 7,615,804 B2* | 11/2009 | Nagahama et al. | 257/190 |
| 2001/0013608 A1* | 8/2001 | Kobayashi et al. | 257/88 |

* cited by examiner

*Primary Examiner* — Jessica Stultz
*Assistant Examiner* — Michael Carter

(57) ABSTRACT

The present disclosure relates to a diode laser and a method for producing the same. In one embodiment, the diode laser, comprises a passive pedestal layer structure, an active ridge layer structure positioned over the passive pedestal layer structure, a p-contact contacting a top side of the active ridge layer structure, a first n-contact disposed on a first side of the active ridge layer structure, a second n-contact disposed on a second side of the active ridge layer structure and, an n-final-metal layer connecting the first n-contact metal and the second n-contact metal, wherein the n-final-metal layer is continuous over the active ridge layer structure.

8 Claims, 10 Drawing Sheets

SINGLE RIDGE N-P-N DIODE LASER

CROSS REFERENCE TO RELATED APPLICATIONS

This application claims the benefit of U.S. Provisional Patent Application Ser. No. 61/329,286, filed Apr. 29, 2010, which is herein incorporated by reference in its entirety.

REFERENCE TO GOVERNMENT FUNDING

This invention was made with Government support under Contract No. N66001-06-C-2045, awarded by SPAWAR Systems. The Government has certain rights in this invention.

FIELD OF THE INVENTION

The present invention relates generally to optical systems and amplifiers.

BACKGROUND OF THE DISCLOSURE

Diodes are uniquely efficient sources of diffraction-limited light. However, diode lasers are limited today to approximately 1 watt (W) in single-mode emitted power, preventing their direct application to directed energy and other important applications. Spatially single mode diode lasers emitting 10 W or more are needed for diverse applications.

Certain practical directed energy systems are predicated on the availability of efficient single-mode continuous wave (cw) lasers at 10 kilowatts (kW) and above. Diode lasers are capable of 50% to 75% power conversion efficiency, but, to date, power scaling of diode lasers beyond 1 W remains an elusive goal, whereas efficient combining of $10^4$ or more independent array elements to achieve a single-mode cw source may not be practical.

As today's applications at or above 10 kW become increasingly important, the opportunity to return to 50% or higher efficiency beam-combined systems powered by up-to-75% efficient single-mode diode lasers becomes increasingly relevant to meeting real system requirements. Thus, any opportunity to increase single-mode power significantly beyond 1 W is crucially important.

SUMMARY OF THE INVENTION

The present disclosure relates to a diode laser. In one embodiment, the diode laser, comprises a passive pedestal layer structure, an active ridge layer structure positioned over the passive pedestal layer structure, a p-contact contacting a top side of the active ridge layer structure, a first n-contact disposed on a first side of the active ridge layer structure, a second n-contact disposed on a second side of the active ridge layer structure, and an n-final-metal layer connecting the first n-contact metal and the second n-contact metal, wherein the n-final-metal layer is continuous over the active ridge layer structure.

In another embodiment, the present disclosure also relates to a method for producing the diode laser. In one embodiment, the method provides a substrate having a passive pedestal layer structure, forms an active ridge layer structure positioned over the passive pedestal layer, applies a p-contact on top of the active ridge layer structure, forms a first n-contact and a second n-contact on opposite sides of the active ridge layer structure and connects the first n-contact and the second n-contact via a metal layer that runs continuously over the active ridge layer structure.

In one embodiment the present disclosure also relates to a method for optimizing a diode laser. In one embodiment, the method produces one or more first diode lasers of systematically varying design having a vertically coupled large area (VECLA) structure, performs at least one measurement for a diode laser of each design, determines how to modify one or more parameters of the diode laser in accordance with a pre-defined amount that is determined by comparing values of one or more parameters associated with the at least one measurement, to one or more parameters associated with a baseline design and produces a second diode laser by modifying the one or more parameters that was thusly determined.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
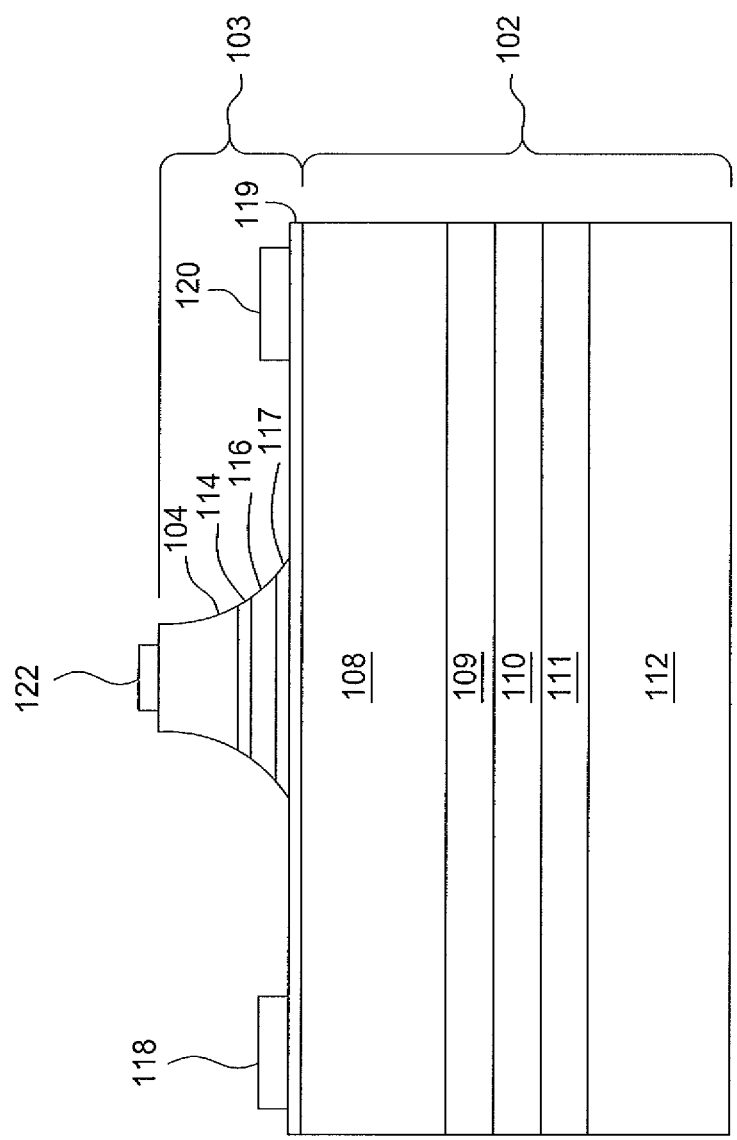
FIG. 1 illustrates a cross sectional view of one embodiment of a VECLA diode laser.

FIG. 1 illustrates a cross sectional view of one embodiment of a VECLA diode laser 100. In one embodiment, the VECLA diode laser 100 comprises an active ridge layer structure 103 (consisting of layers labeled 104, 114, 116, 117, and 119) positioned over a passive pedestal layer structure 102. The passive pedestal layer 102 comprises a passive waveguide layer 108, an n-clad layer or cladding layer 109, a spoiler layer 110, a substrate-graded-index (sub-GRIN) layer 111 and a substrate layer 112. In one embodiment, the thickness of the passive pedestal layer structure 102 may be approximately 12 to 13 microns (μm). In one embodiment, the height of the active ridge layer structure may be approximately 1 μm to 1.75 μm.

In one embodiment, the passive waveguide layer 108 is undoped and is a compound semiconductor alloy substantially comprising aluminum (Al), gallium (Ga) and arsenic (As). The thickness of the passive waveguide layer 108 may be approximately 3 μm. The substrate layer 112 may comprise GaAs and may be undoped in an n-p-n diode laser.

In one embodiment, the cladding layer 109 provides a relatively lower-refractive-index needed to confine the fundamental transverse optical mode that is determined by the entire layer structure comprising both the passive pedestal layer structure and the active ridge layer structure. At the same time, the cladding layer 109 confines the first-order transverse optical mode, the second-order transverse optical mode and the other higher-order transverse optical modes. The first-order and second-order transverse optical modes are not confined as effectively as is the fundamental transverse optical mode, due to their lower modal index values. All modes are evanescent in the cladding layer 109. By contrast, only the fundamental transverse optical mode is evanescent in the spoiler layer 110 positioned beneath the cladding layer 109. The first-order transverse optical mode and the second-order transverse optical mode are oscillatory in the spoiler layer 110, and accordingly these modes suffer appreciable optical radiation loss to the substrate layer 112 through the sub-GRIN layer 111.

As a result, the fundamental transverse optical mode has low radiation loss of approximately 0.1 cm$^{-1}$ or lower, per design, with all higher order transverse optical modes suffering from substantial radiation loss through the sub-GRIN layer 111 to the substrate layer 112. The higher losses, more than 10 cm$^{-1}$, cause the first-order and second-order modes, and all other such transverse modes, to be discriminated against in reaching lasing threshold optical gain and, therefore, to be suppressed under normal laser operating conditions. Thus, the structure of the passive pedestal layer structure 102 enhances transverse optical model discrimination substantially, thereby, allowing for single transverse mode lasing operation.

In one embodiment, the active ridge layer structure 103 includes a p-contact and p-clad layer 104 and an active GRIN separate confined heterostructure (GRINSCH) 114/116/117/119. The GRINSCH may be based upon a 40% to 20% grading of aluminum mole fraction in the top layer 114 of the GRINSCH. The active ridge layer structure 103 also includes an indium (In)GaAs quantum well including GaAs barrier layers 116 and upper and lower GRIN layers 114 and 117/119 respectively that surround the InGaAs quantum well 116. A p-contact 122 is coupled to a top of the active ridge layer structure 103.

The VECLA diode laser 100 also comprises a first n-contact 118 and a second n-contact 120 coupled to an n-doped lower GRIN layer 119 located under the undoped GRIN layer marked 117 in the active ridge layer structure 103. Two n-contacts provide a significantly reduced electrical series resistance, during laser operation, compared to that of a single n-contact. The first n-contact 118 and the second n-contact 120 are juxtaposed on opposite sides of the ridge formed in the active ridge layer structure 103 (comprising layers 104/114/116/117/119). It should be noted that, accordingly, the VECLA diode laser 100 has an n-p-n configuration electrode structure. In addition, the first n-contact 118, the second n-contact 120 and the p-contact 122 are all located on a top side of the active ridge layer structure 103 (comprising layers 104/114/116/117/119).

In one embodiment, the p-contact 122 comprises a titanium (Ti) platinum (Pt) gold (Au) contact metalization structure, as will be recognized by those skilled in the art. In one embodiment, the first n-contact 118 and the second n-contact 120 may each comprise a palladium (Pd) germanium (Ge) metalization structure, an atypical contact metalization structure. The use of PdGe provides sufficiently low contact resistance for n-type contacts to n-AlGaAs alloys used in the layer 119 (rather than n-GaAs alloys), in the etched regions adjacent to the active ridge layer structure.

In one embodiment, the use of a PdGe n-contact metalization scheme provides two advantages over other types of metals known to those skilled in the art of laser diodes. One advantage is conferred especially for diodes with relatively high aluminum content of the n-contact layers, as in the laser diodes disclosed herein. In particular, a PdGe metalization scheme provides a low contact resistance for n-type contacts to n-AlGaAs alloys. A second advantage of the PdGe n-contact metalization scheme, differing from other commonly used n-contact metalization schemes, is that it is characterized by smooth and uniform alloying with the underlying n-doped semiconductor. With PdGe, there are no asperities creating microscopic metal-semiconductor alloy spikes protruding into the underlying semiconductor structure. Spiking is associated with unacceptable waveguide loss which otherwise would affect the diode laser efficiency.

In one embodiment, the VECLA diode laser 100 is designed with a "dilute" waveguide. In other words, the VECLA diode laser 100 is configured such that only a small portion of the fundamental transverse optical mode defined by the combination of the active ridge layer structure 103 (comprising layers 104/114/116/117/119) and the passive pedestal layer structure 102 overlaps the gain-producing quantum-well regions 116 contained within the active ridge layer structure. The lower modal overlap confers a suppression of refractive index changes that otherwise cause filamentation of the optical mode. The term filamentation denotes a non-linear self-focusing effect that prevents fundamental optical modes of lateral width greater than a few, e.g., typically 4, microns in conventional diode lasers. In one embodiment, the overlap of the quantum well regions 116 as taught here is only approximately 0.1%, which is 10 times less than that of conventional diode lasers. Consequently, a very small amount of optical nonlinearity and self-focusing is obtained, which confers substantial resistance to filamentation nonlinearities.

In one embodiment, it is another feature of the presently taught laser diode design that passive optical propagation loss be 0.1 cm$^{-1}$ or less. The low optical propagation loss permits the extension of the laser length to more than 10 mm, and as much as 40 mm or greater. Conventional diode lasers are no longer than approximately 4 mm, and legacy diode lasers are typically 0.5 mm or less in length. The low optical loss is obtained by the particular properties of the fundamental transverse transverse mode determined by the combination of the passive pedestal layer structure and the active ridge layer structure, such that the fundamental optical mode propagates substantially in the undoped, or very low-doped, passive pedestal layer structure. Optical propagation loss is minimized in low-doped layers. The overlap of the fundamental optical mode to the doped regions of the active ridge layer structure is, by comparison, much smaller.

Low antiguiding permits substantially wider ridges than the 3 μm wide ridges employed in conventional ridge guide diode layers. For example, the active ridge layer structure 103 of the present disclosure may be from 10 to 20 μm wide. This allows substantially higher single-mode powers from a single-ridge than is conventionally obtained using diode laser technology.

However, to achieve such optimal performance, optimization of the VECLA diode laser 100 is not trivial. This is because it is, in general, impractical to predict, with adequate accuracy, the refractive index of, e.g., active quantum well layers 116 and surrounding layers containing non-negligible non-equilibrium concentrations of both electrons and holes under forward-biased lasing conditions. In addition, depending on methods utilized to fabricate the passive pedestal layer structure, layers may be inadequately characterized as to their refractive index values to the accuracy needed to predict modal discrimination properties or properties of the fundamental mode without conducting experimental trials.

In any particular fabrication procedure, however, once a suitable design is arrived at through the herein-taught optimization procedure based upon a particular selection of layer materials, compositions, doping, and thicknesses, further optimization is not necessary In general the herein-taught optimization procedure utilizes measurements of threshold current density, emission spectrum, near-field transverse radiation profile, and far-field transverse radiation profile for an array of incrementally adjusted compositionally diverse designs that may be fabricated in parallel to arrive at an optimized design.

For example, it is important to balance the refractive index values across the overall structure to obtain the desired fundamental VECLA transverse optical mode. By way of explanation, if index values should be imperfectly balanced, the result may be either, firstly, insufficient gain for the fundamental transverse optical mode associated with excessive threshold current density and optical loss in the active ridge layer structure, or, alternatively, a concentration of the fundamental transverse optical mode intensity in the active ridge layer structure at the expense of the passive pedestal layer structure. In the latter case, the substantial benefits of the herein-taught laser diode design may be mitigated or negated.

As a result, a method was developed and is taught to optimize the VECLA diode laser 100 that takes into consideration the need to balance the refractive index across the transverse layer structure.

Figure 6:
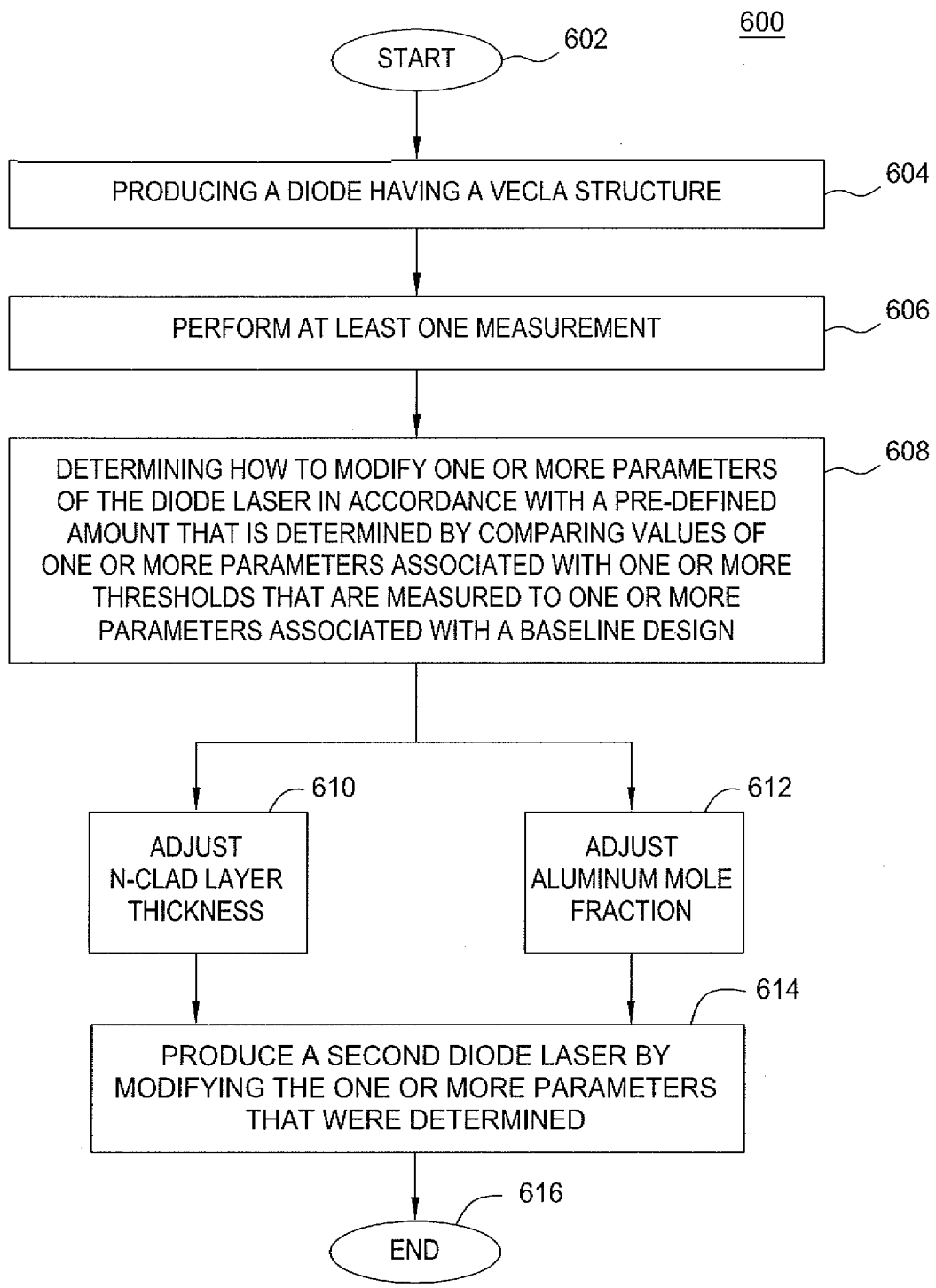
FIG. 6 illustrates a high level block flow diagram of one embodiment of a method optimization for a diode laser.

FIG. 6 illustrates a high level block flow diagram of a method 600 for optimization of a presently taught diode laser, e.g., the VECLA diode laser 100. The method 600 may be applicable both for n-p-n diode lasers and/or for n-p traditional diode lasers, i.e., those relying on a scheme of n-contact through an n-doped substrate and p-contact to the top of a ridge or other waveguiding structure such as a buried heterostructure, as the term is used by those skilled in the art. It should be noted that one or more steps of the method 600 may be carried out by one or more pieces of hardware, e.g., a processor, a computing device, a diode laser manufacturing equipment, a measurement device, a sensor, and/or a processor with simulation software applications. For example, the method 600 may be carried out by a processor executing instructions stored on a non-transitory computer readable medium, e.g., a memory, a disk, an optical storage medium, a magnetic storage medium and the like.

The method 600 begins at step 602. At step 604, the method 600 produces a diode laser. For example, the diode laser may be an n-p-n diode laser having a VECLA structure or an n-p traditional diode laser having a VECLA structure.

At step 606, the method 600 performs at least one measurement for a parameter, e.g., measures a threshold current for the diode laser, performs spectrum, near-field and far-field transverse radiation pattern measurements, and the like. For example, in one embodiment, the threshold current should be less than 1000 amperes (A) per square centimeter ($cm^2$). In one embodiment, the threshold current should be less than 500 A/$cm^2$. The precise value depends on the number of quantum wells and the design of the active ridge layer structure. If the measured threshold current is not at a desirable value, a modification to one or more parameters of the diode is likely needed to optimize its performance. Further, if the lasing spectrum occurs at an excessively short wavelength with high threshold current density for test laser devices of adequate length and mirror coating, such that the mirror cavity loss ($=1/(2L) \ln (1/R_1 R_2)$, where L is the laser longitudinal cavity length, and $R_1$ and $R_2$ are the mirror reflectivities of the two facets), is in compliance with a design calling for a suitable optical gain at threshold from the diode laser structure (scaled from a conventional design by the reduction in overlap factor $\Gamma_{QW}$ which is reduced by approximately 10× in the herein-taught laser design as opposed to conventional laser diode designs), it signals that the fundamental transverse mode overlap to the quantum well regions 116 is insufficient. Suitable requirements for lasing gain may be estimated using the mirror cavity loss as a lower limit for optical loss in the laser cavity. The available fundamental transverse mode optical gain may be estimated by multiplying the modal overlap to the quantum well gain region 116 by the physical constraints on optical gain available within the quantum well gain region 116 for efficient lasing operation, typically in the range of 500 to 2000 $cm^{-1}$.

At step 608, the method 600 determines how to modify one or more parameters of the diode laser in accordance with a pre-defined amount that is determined by comparing values of one or more parameters associated with one or more thresholds that are measured to one or more parameters associated with a baseline design. For example, data may be collected ahead of time to determine what effect changing various parameters may have on the performance of the n-p-n diode laser. One parameter may be to adjust the aluminum mole fraction of the GRINSCH terminus, i.e., the highest-refractive-index composition parameter specifying the design of the linear-compositionally graded AlGaAs layers 114 and 117/119 forming the GRINSCH structure within the active ridge layer structure. For example, it is found that adjusting the aluminum mole fraction GRINSCH terminus in 1% increments may provide sufficient resolution to arrive at the necessary performance improvements in the n-p-n diode laser.

In one embodiment, multiple n-p-n diode lasers having various aluminum mole fractions may be simulated numerically to obtain multiple possible fundamental transverse optical mode intensity profile as a function of transverse position within the laser diode structure to select an optimum baseline design target. A desirable baseline design is one in which sufficient modal gain is provided to support lasing of the fundamental transverse optical mode with moderate non-equilibrium carrier densities, permitting moderate lasing threshold current density and low optical loss, in the quantum well gain regions 116, while simultaneously maintaining the bulk of the fundamental transverse optical mode in the passive pedestal layer structure. By maintaining the bulk of the fundamental transverse optical mode in the undoped passive pedestal layer structure, the attributes of low optical nonlinearity and low optical propagation loss are conferred on an optimized transverse optical mode structure. By this process, the modal profile may be designed and plotted for various diode laser designs having 1% incremental changes in aluminum mole fraction of the GRINSCH terminus.

Thus, if the measured threshold current density is out of the desirable range, then it may be determined where the transverse optical mode profile is concentrated for the test diode laser article, relative to the desired baseline target. For example, a range of incremental test structures may be fabricated and threshold current densities assessed as a function of the GRINSCH terminus aluminum mole fraction. This comparison may provide the percent mole fraction that needs to be added or subtracted to produce a subsequently optimized diode laser.

In one embodiment, the purpose of near-field and far-field transverse radiation pattern measurements is to verify the proper modal properties, per intended design, of the fabricated trial lasers. Transverse near-field measurements enable verification that the intended and simulated fundamental transverse mode profile has been achieved in the test device structure. For example, if the simulated transverse optical mode width is 2 µm at half-maximum, this should be observable in the near-field measurement. If the field is significantly more narrow, it is an indication that the mode is unbalanced such that it is excessively concentrated in the active ridge layer structure rather than, as intended, in the passive pedestal layer structure. It may also be an indication that the lasing mode in that particular trial design is not the fundamental transverse mode but is a higher-order transverse mode such as the first-order transverse mode or second-order transverse mode. The remedy will be either to restore balance by one of typically three methods. These three methods are either, firstly, by selecting the proper GRINSCH terminus (or equivalent) parameter, secondly, by adjusting though compositional compensation the refractive index of any doped layers in the passive pedestal layer structure, or thirdly and finally, by adjusting the thickness of the n-clad region to increase, and thereby provide adequate, transverse mode discrimination between the desired fundamental transverse optical mode and the undesired higher-order modes.

The aforementioned enumeration of three methods for optimizing the fundamental transverse optical mode is not meant to be truly comprehensive inasmuch as other disturbances to the laser design can, if the design has not been correctly executed, prevent the proper functioning of the herein taught diode laser.

By way of example, the thickness of the substrate-graded-index layer, if insufficient, would disturb the necessary discrimination against higher-order modes, just as would the introduction of other layers in the substrate, i.e., submerged further below the substrate-graded-index layer, that tend to produce reflections from the substrate.

Measurement of transverse far-field modal radiation patterns is important to determine the proper device design among the parameter sequence by GRINSCH terminus (or equivalent) in order to determine the correspondence between the far-field radiation pattern width and the design value for the fundamental transverse lasing mode. The distinction between far-field and near-field data is as follows. Because of diffractive effects, it is not generally convenient to measure the width of the near-field transverse radiation pattern accurately, but it is convenient to do so for the far-field transverse transverse pattern. Hence, the far-field radiation pattern width is quantitatively more significant in comparison to the design value than is the near-field transverse pattern width.

However the far-field transverse pattern width has the drawback that the presence of a narrow, undesired, transverse near-field pattern together with a broader, desirable, near-field transverse radiation pattern in the emission from a single trial diode laser may not be revealed. This is because the narrow, undesired transverse pattern may give rise to an unusually broad far-field transverse radiation pattern that may experimentally appear faint in the far-field and therefore be neglected. This is why the near-field transverse measurement, although it is not convenient to interpret with a high degree of quantitative accuracy, is nonetheless needed as confirmation that the desired mode has been selected by the optimization procedure.

It will be appreciated both that, firstly, other parameterizations of the layer structure, other than GRINSCH terminus, may be substituted for incrementing the aluminum mole fraction, and that, secondly, other materials may be substituted for aluminum gallium arsenide either in the active ridge layer structure or in the passive pedestal layer structure to effect a similar optimization and assessment enabling conclusion of a suitable laser diode structure according to the present teaching.

For example, InGaAsP-based semiconductor materials can be substituted as deemed preferable in the active ridge layer structure either selectively or in the entirety of the active ridge layer structure. By way of another example, such materials may also be substituted in the pedestal layer structure. Other compound semiconductor material systems may be used as well.

However, by virtue of the n-p-n design obviating the requirement for current flow through a substrate layer, the design of the pedestal layer structure may be altered to incorporate other materials, some candidates for which may not support low-resistance current flow, despite it being necessitated by conventional or legacy n-p diode laser designs.

In this connection, higher-bandgap materials for the pedestal layer are of particular interest for the pedestal layer. Such materials may or may not be lattice-matched to the materials of the active ridge layer structure. They may be affixed thereto by processes such as epitaxial lift-off and deposition, or other diverse methods including, but not limited to, conventional epitaxy, or by a combination of such diverse materials growth or fabrication procedures. One particular benefit of employing such higher-bandgap materials partially or in entirety for the pedestal layer structure is the mitigation of nonlinear multiphoton absorption (See e.g., P. W. Juodawlkis, J. J. Plant, J. P. Donnelly, A. Motamedi, and E. P. Ippen, *Continuous-wave two photon absorption in a Watt-class semiconductor optical amplifier*, August 2008/Vol. 16, No. 16/OPTICS EXPRESS(C) 2008 Optical Society of America) causing absorption in the pedestal layer structure. Such higher band-gap materials can be alloy semiconductors such as GaP- or AlGaN-based materials, including InAlGaN alloys, or may be based upon materials conventionally considered insulators such as $SiO_2$, $Al_2O_3$, $Si_3N_4$, or related materials having bandgaps greater than ca. 8 eV typical of insulating materials.

In a general sense, a benefit accrues from maintaining a greater mode field intensity in the passive pedestal layer structure than in the active ridge layer structure, a feature provided by the herein-taught design. Accordingly, multiphoton absorption in the active ridge layer structure may be minimized. Multiphoton absorption may be substantially avoided in the passive pedestal layer structure when higher bandgap materials are employed there. However, notwithstanding, it must be emphasized the increased mode cross-section in the transverse and lateral dimensions, alone, even without entailing the use of higher-bandgap materials to minimize multiphoton absorption processes in the passive pedestal layer structure, provides for dramatically higher single-mode powers of the diode laser articles taught herein.

In one embodiment, another parameter to be adjusted through optimization may be a thickness of one of the layers in the pedestal. For example, it was found that increasing the thickness of the n-clad layer 109 provides performance improvements such as increasing gain margin between the fundamental transverse optical mode and higher-order transverse optical modes such as the first-order transverse optical mode and the second-order transverse optical mode. For example, thickening the n-clad layer 109 from 1.0 µm to 2.5 µm was found to provide 30 $cm^{-1}$ of gain margin between the fundamental transverse optical mode and the higher-order optical modes.

It should be noted that although parameters such as aluminum mole fraction and n-clad layer thickness are discussed, it should be noted that other parameters may also be modified.

In other words, one important factor is to recognize the need to optimize the diode laser performance by balancing the refractive index values using one or more parameters, e.g., aluminum mole fraction, n-clad layer thickness and the like.

At steps 610 and 612, the method determines which parameters should be modified and to what degree. For example, the method 600 at step 610 will modify an n-clad layer thickness. At step 612, the method 600 will make an adjustment of the aluminum mole fraction.

Referring back to step 614, the method 600 at step 614 produces a second diode laser by modifying the one or more parameters that were determined. The method 600 ends at step 616.

Figure 7:
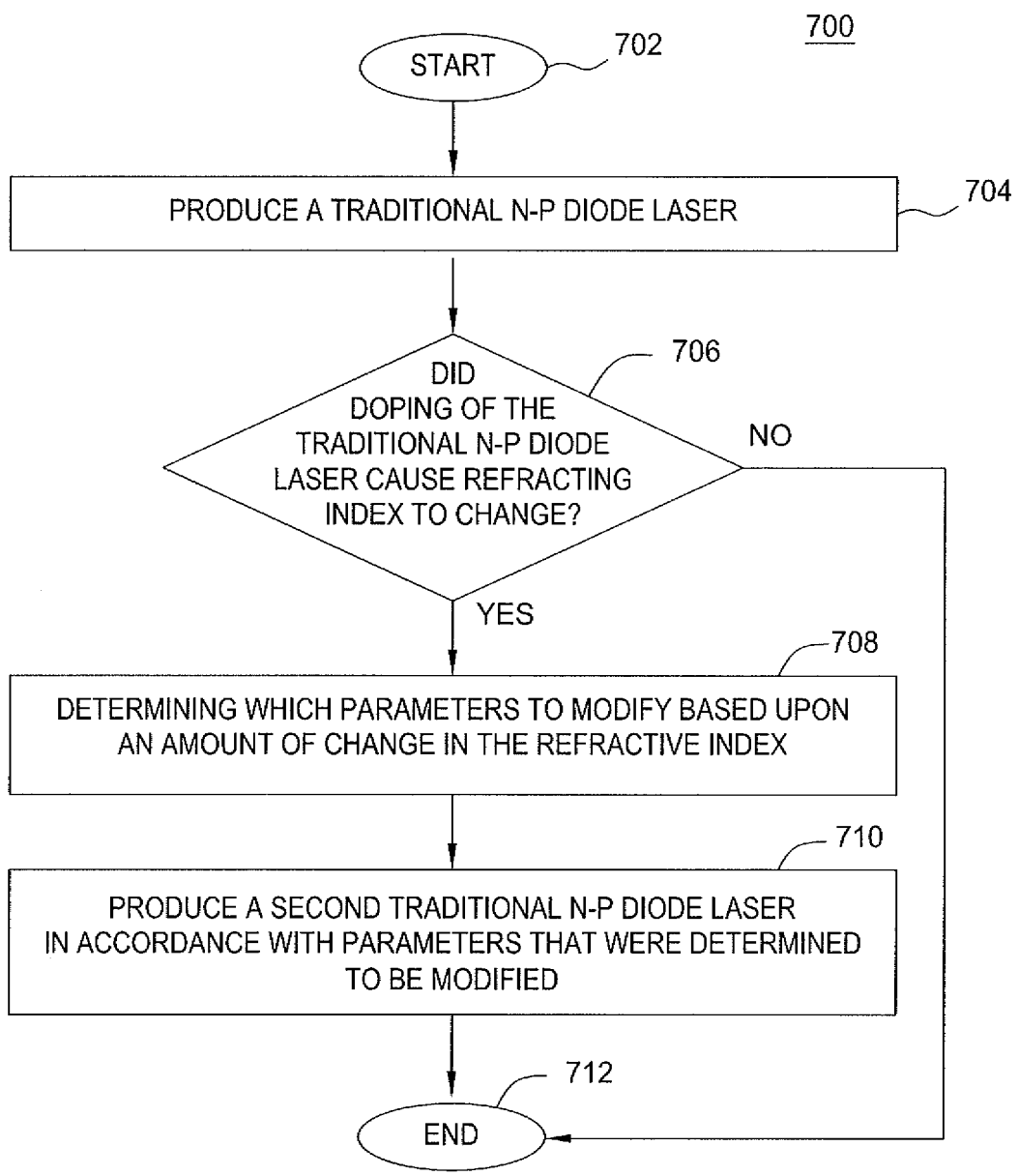
FIG. 7 illustrates a high level block flow diagram of one embodiment of a method of optimization for an n-p traditional diode laser.

In addition, FIG. 7 illustrates another method 700 that was developed for optimizing an n-p traditional diode laser, i.e., one in which n-type electrical contact is provided at the reverse, substrate, side, of a wafer of laser chips, and, p-type electrical contact is provided at the obverse, epitaxy, side of the wafer of laser chips. In such conventional laser diodes, no n-type electrode is found at the obverse face of the wafer, nor of chips subsequently fabricated by the process of singulation from the wafer. Hence, an n-doped substrate is typically entailed by the conventional laser diode fabrication scheme. However the herein taught VECLA laser structure nevertheless has dramatic benefits for the n-p traditional diode laser configuration, and in some applications, the simpler processing scheme afforded by dispensing with the special crossover metalization scheme entailed by the n-p-n diode laser configuration may have economic value outweighing the drawback of modest optical losses associated with the use of low doping, e.g., in the range of $5 \times 10^{16}$ cm$^{-3}$ or less, in the waveguide 108 and n-clad 109 layers of the pedestal 102 and with the inability to conveniently connect multiple ridges in series electrically. It should be noted that the method 700 may be carried out by one or more pieces of hardware as discussed above. For example, the method 700 may be carried out by a processor executing instructions stored on a non-transitory computer readable medium.

The method 700 begins at 702. At step 704, the method 700 produces an n-p traditional diode laser. At step 706, the method 700 determines if doping of the n-p traditional diode laser causes a refractive index to change. Doping in n-p traditional diode lasers can alter and cause a stepping in the refractive index. For example, doping concentrations of $10^{18}$ cm$^{-3}$ can cause a ca. 0.001 index step that, while small, is sufficient to alter and render unusable the transverse optical modes properties. As a result, if the method 700 at step 706 determines that the refractive index has not changed, then the method 700 may proceed to step 712 where the method 700 ends.

However, if the method 700 at step 706 determines that the refractive index has changed to an extent that may disturb the balance of the herein-taught laser transverse mode operation, then the method may proceed to step 708. At step 708, the method 700 determines which parameters to modify based upon an amount of change in the refractive index. For example, various parameters may be modified such as, for example, the n-clad layer thickness or an aluminum mole fraction. The amount to modify these parameters is similar to methods employed and discussed above with respect to step 608 discussed above in FIG. 6.

At step 710, the method 700 produces a second n-p traditional diode laser in accordance with parameters that were determined to be modified. The method proceeds to step 712, where the method 700 ends.

As a result, using method 600 and/or 700 the diode laser may be optimized. With the proper parameters obtained to achieve optimal performance, the diode laser may be properly manufactured.

Once optimized, the VECLA diode laser 100 provides additional challenges. As noted above, the VECLA diode laser 100 provides an n-p-n contact scheme. That is, the p-contact 122 of the active ridge layer structure 103 is positioned laterally between two n-contacts 118 and 120. However, a submount can only accommodate a lateral n-p electrode scheme with the necessary high electrical conductivity, high thermal conductivity, and alignment tolerance. Hence, the VECLA diode laser 100 must also provide a mating lateral n-p dual-contact topology for mating to the submount.

One embodiment of the present disclosure provides a novel three-dimensional final metallization topology that is employed to transition from the n-p-n contact pattern of the VECLA diode laser 100 to a lateral-n-p electrode pattern of the submount, i.e., such a pattern would provide two electrodes on a submount, such as an aluminum nitride submount, side-by-side, that would mate to the two electrodes on the obverse face of a VECLA diode laser chip. In this respect it is different from a conventional-laser-diode n-p contacting scheme, described above. The final metallization topology is illustrated in further detail in FIG. 2.

Figure 2:
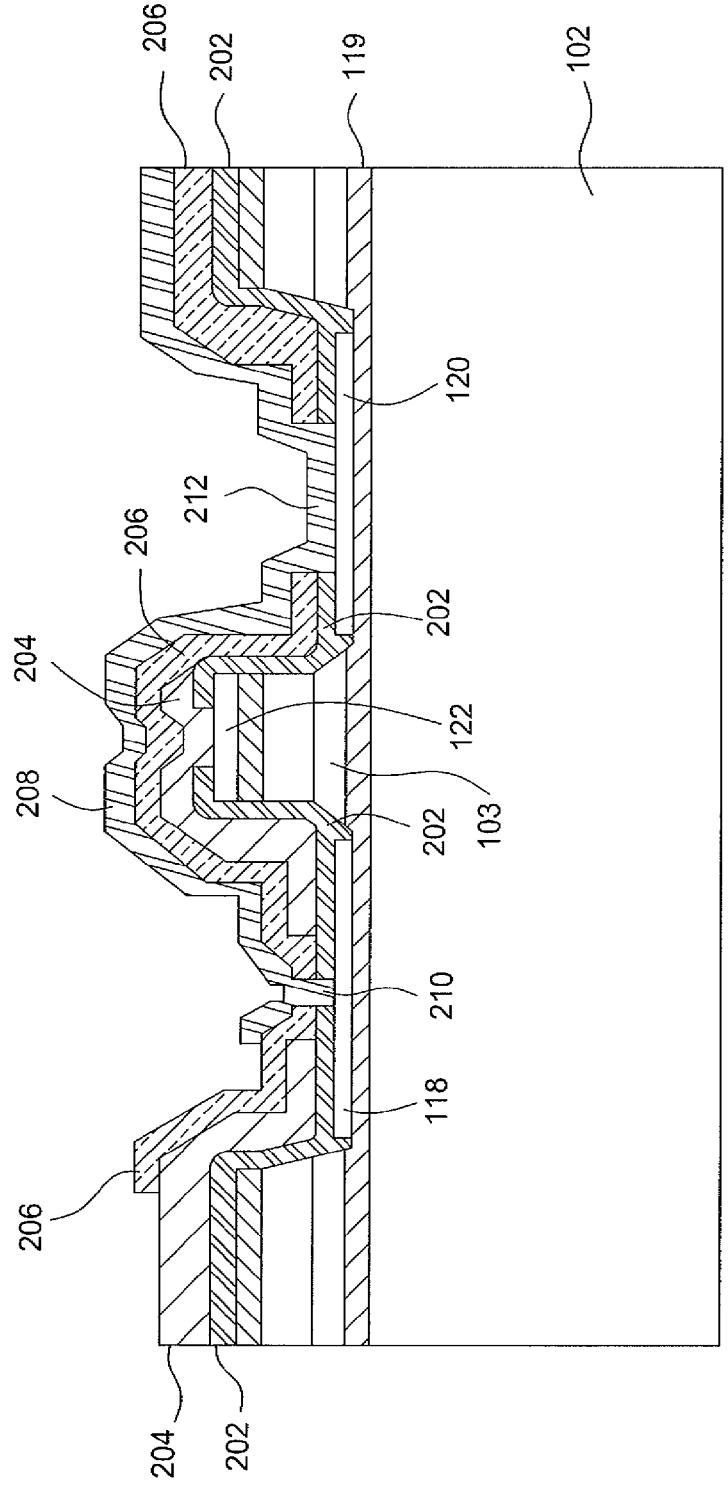
FIG. 2, illustrates a cross sectional view of one embodiment of a VECLA diode laser having cross-over metallization.

FIG. 2 illustrates a cross sectional view of one embodiment of a VECLA diode laser 200 having a cross over metallization topology. In FIG. 2, the view is expanded laterally, as compared to FIG. 1, to show a ridge structure that is situated, with no loss of generality, between two channels. The VECLA diode laser 200 has a basic VECLA structure that is similar to the VECLA diode laser 100 described above with respect to FIG. 1. For example, the VECLA diode laser 200 comprises a passive pedestal layer structure 102 and an active ridge layer structure 103 consisting of layers 104/114/116/117/119 identical to the VECLA diode laser 100 as described above. In addition, the VECLA diode laser 200 includes a first n-contact 118, a second n-contact 120 and a p-contact 122 identical to the VECLA diode laser 100 as described above.

However, to provide a transition from the n-p-n contact pattern to a lateral-n-p electrode pattern, as noted above, the VECLA diode laser 200 includes a crossover-metallization topology. For example, the VECLA diode laser 200 includes a first conformal dielectric layer 202, a p-final-metal layer 204, a second conformal dielectric layer 206 and an n-final-metal layer 208 that provides the cross-over metallization. In one embodiment, the p-contact metal 122 is TiPtAu, the n-contact metal 118 and 120 are PdGeTiPt, and both final metal layers, p-final-metal layer 204 and n-final-metal layer 208, are TiPtAu. In the n-contact metal, the PdGe does the contact formation, and the TiPt decreases the sheet resistance of the layer without affecting the contact formation and inhibits the formation of oxides in the PdGe. The process of producing each of these layers is described in further detail below with reference to FIGS. 4A-4C.

The first conformal dielectric layer 202 and the second conformal dielectric layer 206 serve to completely electrically isolate the p-final-metal layer 204 from the n-final-metal layer 208. As a result, the p-final-metal layer 204 never contacts the n-final-metal layer 208, thereby avoiding any electrical shorts between n- and p-electrodes of the herein-taught laser.

As illustrated in FIG. 2, the n-final-metal layer 208 runs continually over, and, together with the second conformal dielectric layer 206, enshrouds layers 104/114/116/117 of the active ridge layer structure 103 and both the p-contact-metal 122 and the p-final-metal layer 204 as well as the first conformal dielectric layer 202 that covers the ridge. In doing so, the n-final-metal layer 208 electrically connects both the first n-contact-metal 118 and the second n-contact-metal 120 using via structures i.e., a first n-final-metal via structure 210 and a second n-final-metal via structure 212, the metal portion of both via structures being part of the n-final-metal layer 208. The n-final-metal layer 208 is isolated from the p-final-metal layer 204 by the second conformal dielectric layer 206.

FIG. 2 illustrates an opening in the p-final-metal layer 204 over and in the immediate vicinity of the first n-contact-metal 118. The first conformal dielectric layer 202 and the second conformal dielectric layer 206 isolate the p-final-metal layer electrically, such that the n-final-metal layer 208 may fill the opening and electrically contact the n-contact-metal 118.

However, it must be emphasized that the p-final-metal layer 202 is topologically uninterrupted, is electrically continuous, and surrounds the first n-final-metal layer via structure 210. For example, if another cross section were illustrated further down the length of the VECLA diode laser 200, that cross section would not show the n-final-metal layer via structure 210, which would be absent, and the p-final-metal layer would, in that cross section, appear to run continuously, without interruption, from the left side of the FIG. 2, down and over, enshrouding the first n-contact-metal 118, and up and over layers 104/114/116/117 of the active ridge layer structure 103 where in both cross-sections it does make electrical contact in FIG. 2 to the p-contact metal 122.

Figure 3:
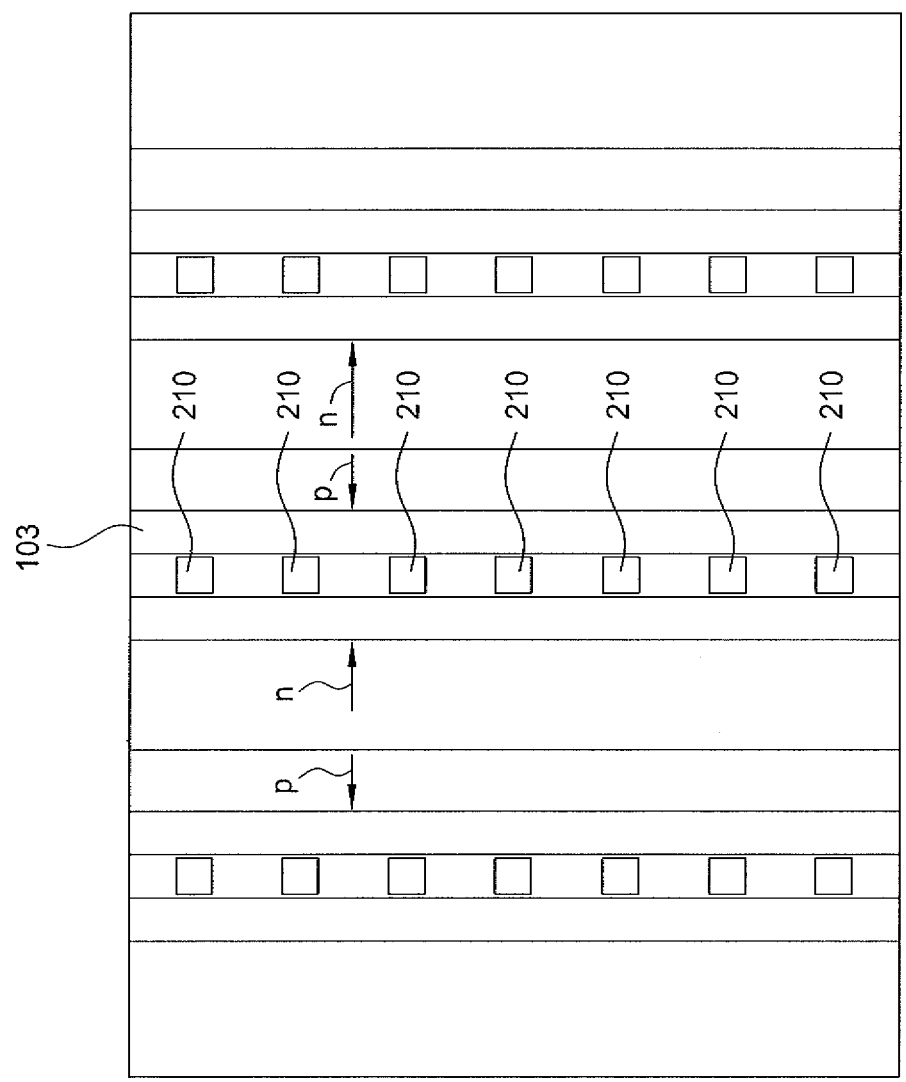
FIG. 3, illustrates a top plan view of one embodiment of the VECLA diode laser having cross-over metallization.

FIG. 3 illustrates a top plan view of one embodiment of the VECLA diode laser 200. FIG. 3 illustrates vias 210 that are seen as rectangles or squares next to the active ridge layer structure 103. For example, the cross sectional view of FIG. 2 is taken through one of the via structures 210. As discussed above, if a cross sectional view were taken between, and not through, the via structures 210, the p-final-metal layer 202 would appear to run continuously and there would be no via structure illustrated in the cross-sectional view. FIG. 3 also illustrates positioning of n-final-metal layer and p-final-metal layer electrodes.

The structure of the VECLA diode laser 200 is unique and provides advantages over current diode lasers. For example, the structure of the VECLA diode laser 200 permits the electrical connection, in series, of multiple lasing waveguides.

Fabrication of cross-over metalization on an etched diode laser ridge is not found in the prior art, and is a subject of the present disclosure. As discussed above, the n-final-metal layer 208 runs continuously up and over layers 104/114/116/ 117 of the active ridge layer structure 103. However, the fabrication of the active ridge layer structure 103 produces corners that are sharp, being characterized by an approximately 90 degree angle that is unrelieved and is unsmoothed. In such a non-planar geometry, strain concentrates at corners. Therefore, any conformal dielectric covering the active ridge layer structure must withstand that strain without cracking.

The integrity of a nominally conformal dielectric layer may be compromised not only by a sharp corner profile, but also by the height of a ca. 1-μm-high ridge structure. Should a dielectric deposition technique of insufficient conformality be employed, in particular a line-of-sight deposition technique such as evaporation, intricate features of unpredictable and uncontrollable morphology obtain at the edges of the ridge. These features typically contain one or more elongated crypts. The crypts directly result in electrical shorting between n-final-metal 208 and p-final-metal 204.

In addition, even when deposition is adequately conformal, and when conventional cracking is been avoided by utilizing recipes providing the appropriate stress and other features, field-induced insulation defects can concentrate at corner points where electric fields are intensified during plasma deposition. Such "microcracks," not visible under scanning electron microscopy, can result in electrical shorting.

In sum, both conformality of deposition of the interlayer dielectric and also the integrity of the interlayer dielectrics 202 and 206 are each critical in achieving a suitable n-p-n diode laser structure.

FIGS. 4A-4K illustrate a flow diagram of an illustrative process 400 for producing the VECLA diode laser 200 having cross-over metallization that addresses some of the issues discussed above as well as other issues. It should be noted that for clarity only those features that are newly introduced at each step of the process 400 are labeled with reference numerals for each step.

Figure 4A:
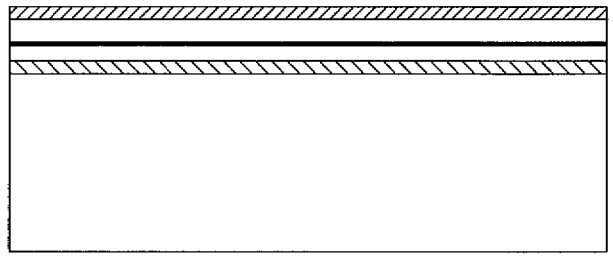
FIGS. 4A-4K illustrate a process flow diagram of one embodiment for producing the VECLA diode laser having cross-over metallization.

The process 400 begins at step 402, as illustrated in FIG. 4A, with a VECLA diode laser epitaxial material structure fabricated to an approximately 14 μm thickness. A metal organic chemical vapor deposition (MOCVD) technique may be advantageously employed. By comparison, an alternative technique of molecular beam epitaxy (MBE), which is a slower growth technique as compared to OMCVD, may be considered unsuitable owing to the greater thickness of the VECLA diode laser epitaxial material structure as compared to that of conventional diode lasers. The VECLA diode laser epitaxial material structure incorporates all layers discussed above with respect to the VECLA diode laser 100 and 200 discussed in FIGS. 1 and 2, respectively.

Approximately 1.6 μm of the VECLA diode laser epitaxial material structure comprises the active layer ridge structure 103, which includes the GRINSCH. The remainder of the VECLA diode laser epitaxial material structure comprises the passive pedestal layer structure consisting of $Al_{0.25}Ga_{0.75}As$ and/or alloys of similar Al mole fraction, and the sub-GRIN layer. The OMCVD-grown Al mole fraction may be controlled by incorporating in situ real time temperature monitoring at two places on each wafer in the reactor. By closely controlling temperature, growth properties are maintained accurately. For example, the Al mole fraction can be controlled to a very high degree. Differences in Al mole fraction of 0.5%, or less, may be significant for achieving a suitable VECLA diode laser epitaxial material structure.

Using the OMCVD technique, the epitaxial growth of structures having thickness greater than ca. 3 μm can be associated with impairments in epitaxial layer morphology. Such morphological defects consist of tiny isolated regions that are unsuitable for device formation. To mitigate the formation morphological defects in the epitaxial wafer surface, special growth conditions have been developed. For example, the passive pedestal layer structure of the VECLA structure may be epitaxially grown at a lower temperature (e.g., lowering the temperature approximately from 725° C. to 675° C.) and at higher growth rate (e.g., increasing the growth rate approximately from 2.5 μm/hour (hr) to 7.5 μm/hr) than utilized in epitaxial growth of the active ridge layer structure portion of the VECLA diode laser epitaxial material structure. The higher growth rate is related to a ratio of Group V element to Group III element (referred to as the "V-III ratio") flow, e.g., to increasing the total Group-III molar flow. For example, it is desirable to lower the V-III ratio by increasing the amount of Group III element. When doing so, one can keep the Group-V flow the same, which therefore decreases the so-called "V-III ratio," a key parameter for organometallic chemical vapor deposition (OMCVD) crystal growth, which is employed in the growth of the present structures as disclosed herein. Controlling these growth conditions mitigates formation of defects visible on the surfaces of, and otherwise substantially impairing, the VECLA diode laser epitaxial material structure.

Figure 4B:
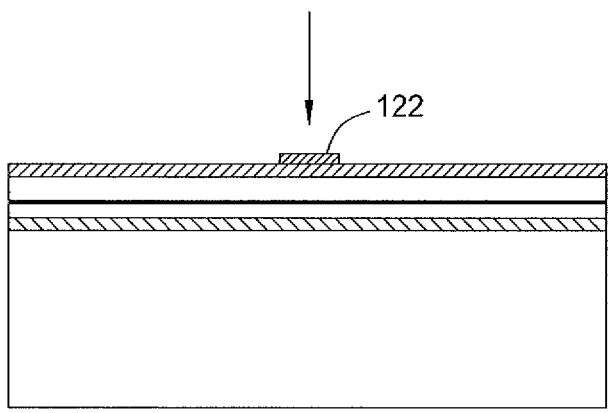
Figure 4C:
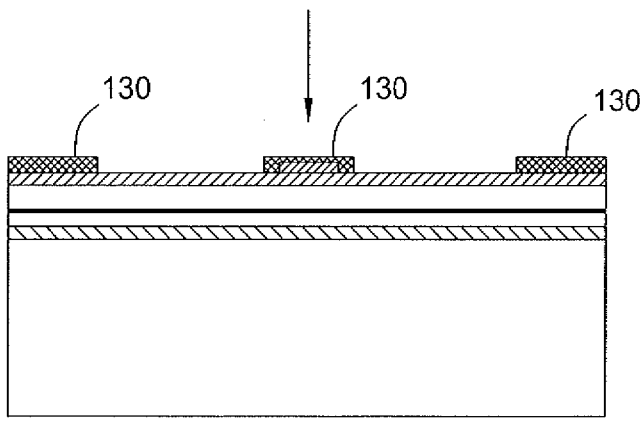

At step 404 in FIG. 4B, the process 400 patterns p-contact metal 122. Metal is deposited onto regions that will be formed subsequently into the active ridge layer structure sections of the VECLA diode laser structure. At step 406 in FIG. 4C, the process 400 performs deposition and etching of a temporary plasma-enhanced chemical vapor deposition (PECVD) silicon nitride layer to be used as an etch mask 130 in wet-etching of the ridge waveguide structure. The deposition and etching of the silicon nitride requires one photolithography step.

During this and subsequent photolithography steps, the VECLA diode laser wafer structure may be held in a consistent fashion while applying a contact pressure. As discussed above, the VECLA structure may be approximately 14 μm thick. Structures of such thickness containing strain can have a sagitta or parabolic curve in the center of the wafer that causes a convex-upward bowing.

The convex-upward bowing is caused by a slight lattice mismatch between the $Al_{0.25}Ga_{0.75}As$, which constitutes the approximate composition of the passive pedestal layer structure, and the approximately 375 μm thick GaAs substrate. Although lattice mismatch is unnoticeable in conventional diode laser epitaxial layers of a few μm thickness, the mismatch is considerably more noticeable for the 14 μm thick VECLA structure.

As a result, a contact pressure may be applied to the VECLA structure, e.g., by placing the VECLA structure between a field chuck and a glass plate and applying pressure. This procedure entails provision of consistent alignment, positioning and orientation of the VECLA structures across multiple contact mask lithography steps to maintain lithographic alignment within appropriate specifications.

Figure 4D:
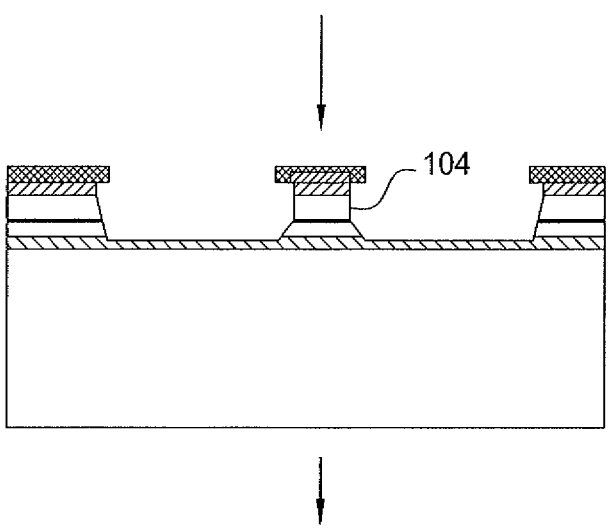

At step 408 in FIG. 4D, the process 400 etches the active ridge layer structure to form the active ridge layer structure 103. The etch depth, which must be precise to expose the n-doped layer in preparation for n-contact formation, is controlled by timing and iterative wet etch. In one embodiment, the wet etch may be a "Caro's Acid" etch that utilizes a sulfuric acid ($H_2SO_4$):hydrogen peroxide ($H_2O_2$):water ($H_2O$) mixture in a volume ratio of approximately 1:8:40 to 1:8:80. The wet etch gives a ridge that is slightly wider at its base than at its top, which minimizes shadowing by the top of the ridge in subsequent photolithography, deposition and etching steps. The advantages of this particular wet-etch chemistry are particularly smooth sidewalls, mitigation of the so-called shower-curtain-effect by which imperfections in the photoresist edges are reproduced on the side of an etched ridge, and low waveguide losses obtained thereby in previous experience with conventional ridge waveguide structures. Subsequently, the silicon nitride etch mask is stripped off.

Figure 4E:
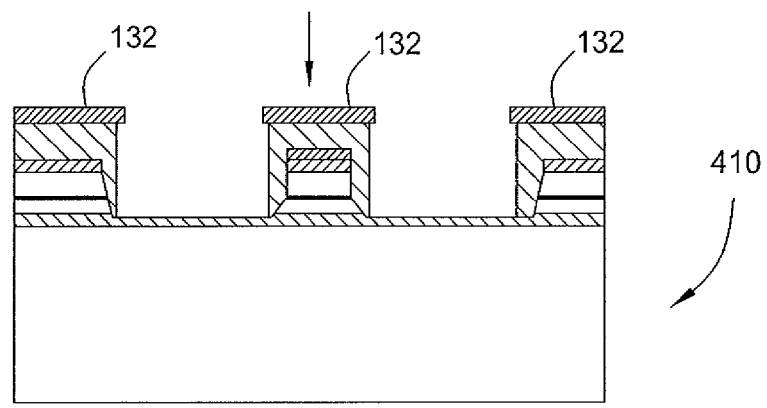
Figure 4F:
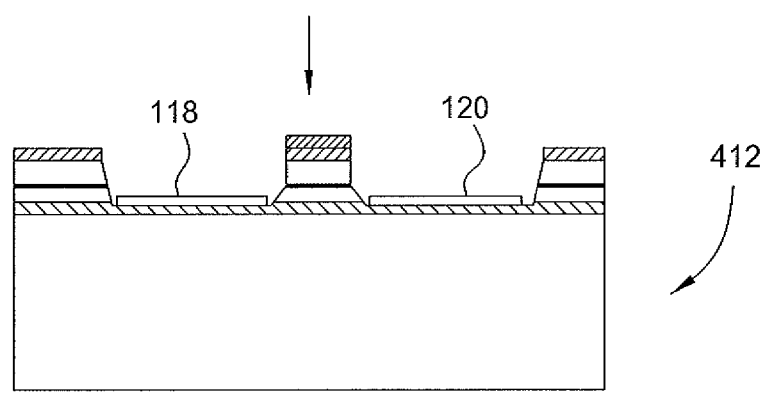

At step 410 in FIG. 4E, the process 400 prepares the VECLA structure for n-contact metallization via a lithography process using photoresist layer 132. The photoresist in FIG. 4E is a bilayer photoresist of which only the upper layer is labeled 132. The immediately lower layer below the photoresist layer 132 in FIG. 4E, with diagonal stripes, is shown to have an undercut relative to the upper layer, which is beneficial for patterning by the lift-off method. At step 412 in FIG. 4F, the process 400 deposits first and second n-metal 118 and 120 onto the VECLA structure on opposite sides of the active ridge layer structure 103, and strips away the photoresist mask.

Figure 4G:
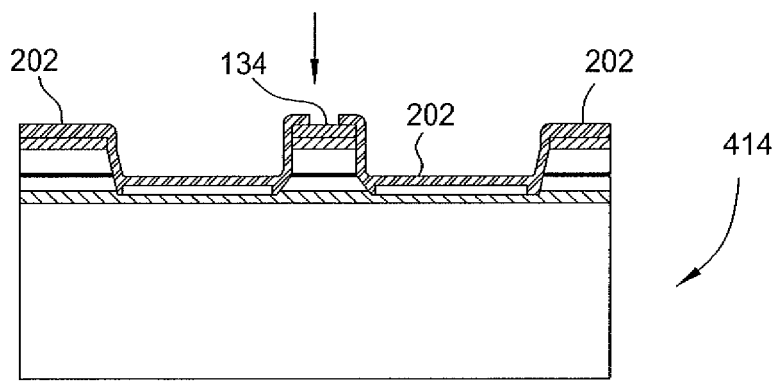

At step 414 in FIG. 4G, the process 400 deposits a first conformal dielectric layer 202, consisting of plasma-enhanced-chemical-vapor-deposition-deposited (PECVD-deposited) silicon nitride. A p-final-metal contact via 134 is etched into the first conformal dielectric layer 202. As discussed above, depositing the dielectric layer 202 over the sharp corners of the active ridge layer structure 103 is liable to create issues of "microcracking".

Thus, the present disclosure teaches a noble gas PECVD deposition technique that is a novel application of the technique with respect to fabrication of ridge-waveguide diode lasers and, in particular, VECLA diode lasers. The noble gas PECVD deposition technique deposits the silicon nitride dielectric layer 202 conformally and with compressive stress to suppress any tendency towards cracking at the corners of the active ridge layer structure 103. In addition, other features of the noble-gas plasma chemistry and dynamics distinguish it from more conventional PECVD deposition using an alternative gas, e.g., $N_2$, as a carrier gas. The noble-gas species, which may become ionized in the PECVD chamber, may indirectly provide enhanced solid-state chemical bonding in the resulting films, which according to our tests possess as a result substantially greater integrity against electrical shorting. Such an effect is consistent with the published literature (See e.g., A. A. Bright, *Helium plasma enhanced chemical vapor deposited oxides and nitrides: Process mechanisms and applications in advanced device structures*, Journal of Vacuum Science and Technology A 9 (3) (May/June 1991), page 1088; and M. Maeda and H. Nakamura, *Insulation degradation and anomalous etching phenomena in silicon nitride films prepared by plasma enhanced deposition*, Thin Solid Films 112 (1984) page 279). In one embodiment, an argon-carrier-gas method may be employed to carry silane gas ($SiH_4$) and ammonia ($NH_3$) source gases for the silicon nitride conformal dielectric layer 202.

Figure 4H:
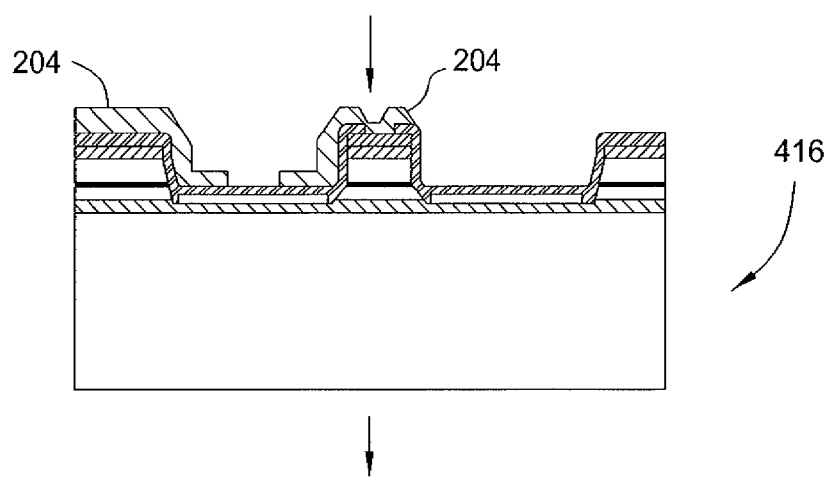

At step 416 in FIG. 4H, the process 400 deposits a p-final-metal layer 204 via sputtering and patterns it by an ion-milling process. The sputtering and patterning by ion-milling process provides conformal coverage of the active ridge layer structure 103. In sputtering, metal atoms or small clusters of metal atoms ejected from the target by the bombardment of energetic ions redeposit on every nearby surface including within the interior of, if present, microcracks in the first dielectric layer 202. The metal deposited by sputtering within microcracks leads to continuous metal bridges into and through the microcracks, which leads directly to, and causes, catastrophic electrical shorting between p-final-metal 204 and n-final metal 206 layers. Hence, the n-p-n diode laser exclusively relies on noble-gas-PECVD silicon nitride in step 414 and step 418.

Figure 4I:
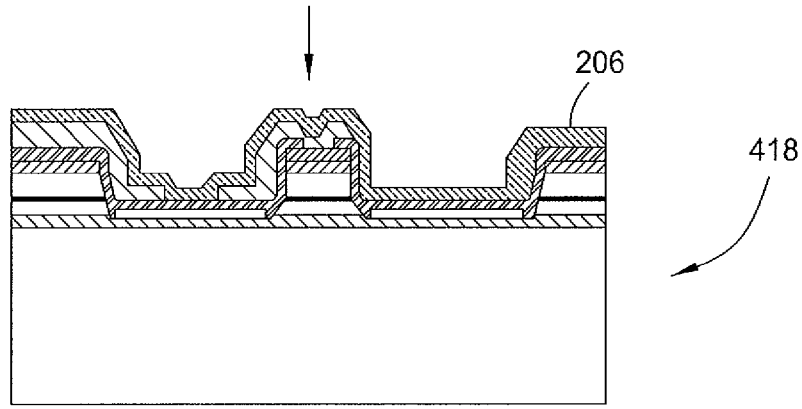
Figure 4J:
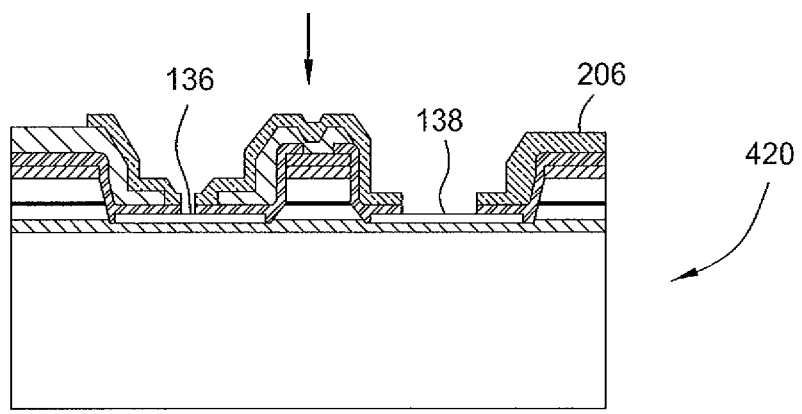

At step 418 in FIG. 4I, the process 400 repeats the noble gas PECVD method to deposit a second dielectric layer 206. At step 420 in FIG. 4J, the process 400 etches vias 136 and 138 into the second dielectric layer 206 to expose the n-contact-metal 118 and 120, subsequently exploited to make contact to n-final metal 208.

Figure 4K:
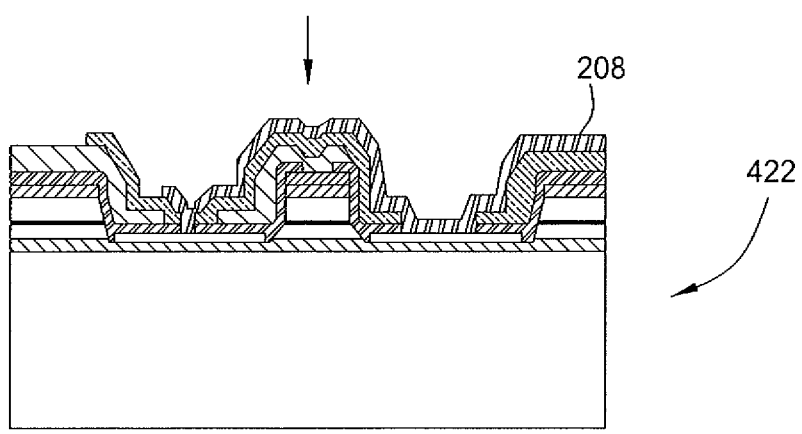

At step 422 in FIG. 4K, the process 400 deposits an n-final-metal layer 208 by sputtering and patterns it by ion-milling. The n-final-metal layer 208 fills the vias 136 and 138, thereby electrically contacting the first n-contact 118 and the second n-metal 120 and runs continuously over the active ridge layer structure 103.

As discussed above, the n-final metal layer 208, provides a cross-over metallization for the VECLA diode laser by connecting the first n-contact 118 and the second n-contact 120. Thus, the n-final metal layer 208 provides a transition from the n-p-n contact pattern to a lateral n-p electrode pattern for mating to a submount. The fabrication process is completed with substrate thinning, cleaving, facet coating and chipping.

Figure 5:
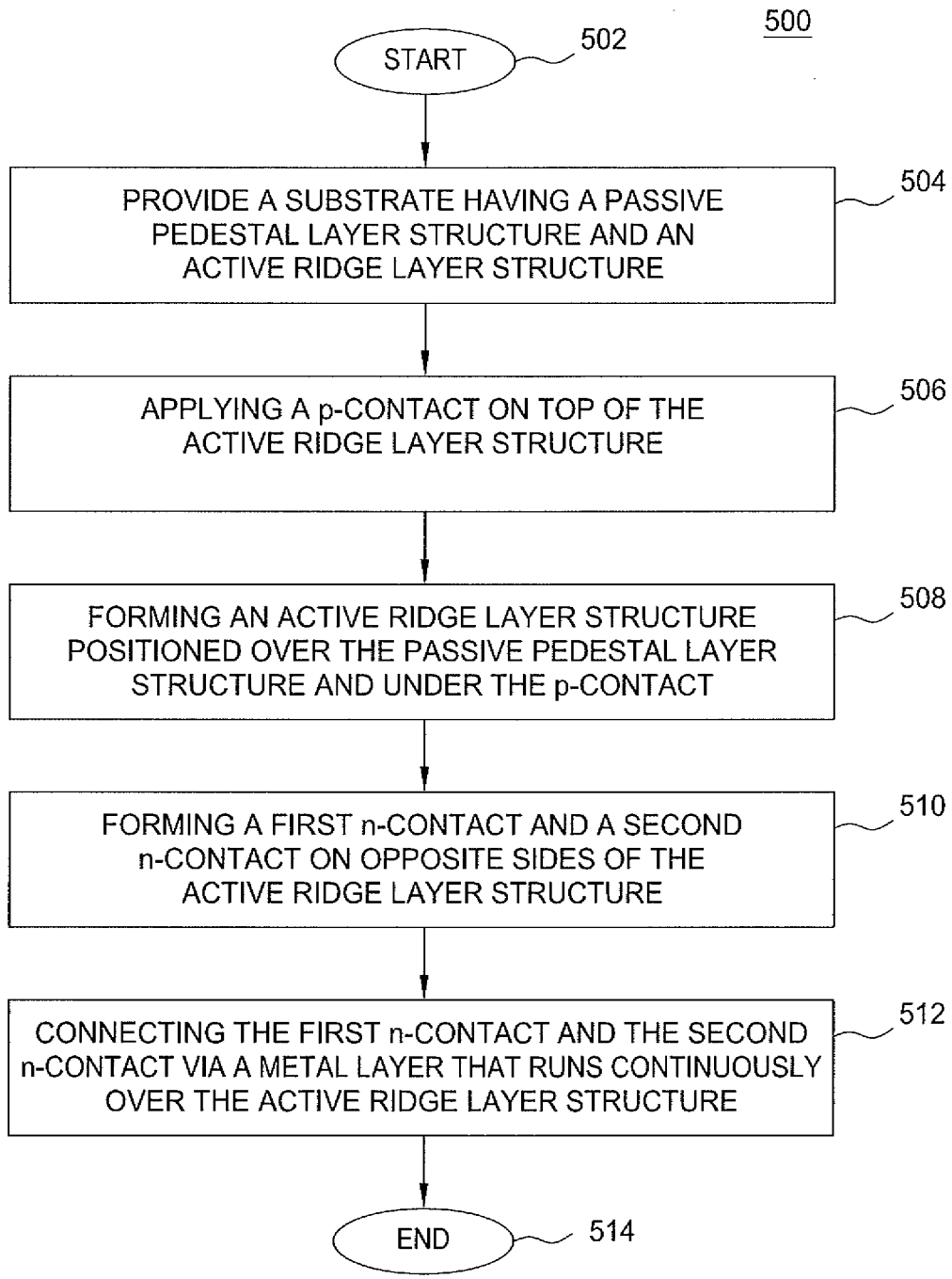
FIG. 5 illustrates a high level block flow diagram of one embodiment of a method for producing the VECLA diode laser having cross-over metallization.

FIG. 5 illustrates a high level block flow diagram of one embodiment of a method 500 for producing the VECLA diode laser having cross metallization. The method 500 may be performed in a series of steps by various hardware elements in an automated system, e.g., a diode laser manufacturing system. For example, a processor may execute computer readable instructions stored on a computer readable medium to produce the VECLA diode laser having cross metallization. The instructions may include process control parameters for controlling the hardware to execute the method 500.

The method 500 is initialized at step 502 and proceeds to step 504. At step 504, the method 500 provides a substrate having a passive pedestal layer structure and an active ridge layer structure (broadly a region where the active ridge layer structure 103 as discussed above will be formed).

At step 506, the method 500 applies a p-contact 122 on top of the active ridge layer structure. At step 508, the method 500 forms an active ridge layer structure positioned over the passive pedestal layer structure and substantially under the p-contact 122. In one embodiment, the active ridge layer structure 103 may be formed by applying a SiN etch mask to delineate the active ridge layer structure and etching through SiN to form the active ridge layer structure. Details about this process are provided above with reference to FIG. 4 in steps 406 and 408.

At step 510, the method 500 forms a first n-contact 118 and a second n-contact 120 on opposite sides of the active ridge layer structure. In one embodiment, forming the first n-contact and the second n-contact may include applying a first n-contact metal and a second n-contact metal on opposite sides of the active ridge layer structure. Then a first SiN conformal dielectric layer 202 is applied over the first n-contact 118 and the second n-contact metal 120 on opposite sides of the active ridge layer structure.

The first SiN conformal dielectric layer 202 is etched to form via structures to connect the p-contact 122 to p-final-metal 204. A p-final-metal is applied or deposited over the via structures, thereby electrically contacting the p-contact 122. In one cross-section as shown in FIG. 2, the p-final-metal 204 may be applied such that there is a "gap" or "opening" over the first n-contact 118. A second SiN conformal dielectric layer 206 is applied over the p-final-metal 204 and the first SiN conformal dielectric layer 202. Then via structures are patterned and etched into the second SiN conformal dielectric layer 206 over the first n-contact 118 and the second n-contact 120.

At step 512, the method 500 connects the first n-contact 118 and the second n-contact 120 via an n-final-metal layer 208 that runs continuously over the active ridge layer structure. The n-final-metal 208 provides cross-over metallization of the first n-contact 118 and the second n-contact 120. As a result, a transition from an n-p-n electrode pattern to a lateral n-p electrode pattern is achieved.

For the first n-contact 118, the n-final-metal layer 208 contacts the first n-contact 118 through an opening in the p-final-metal 204. For example, the p-final-metal 204 is etched and isolated via the conformal dielectric layers to form a "buttonhole" structure, through which the n-final-metal 208 passes to contact the first n-contact 118. The method 500 ends at step 514.

Figure 8:
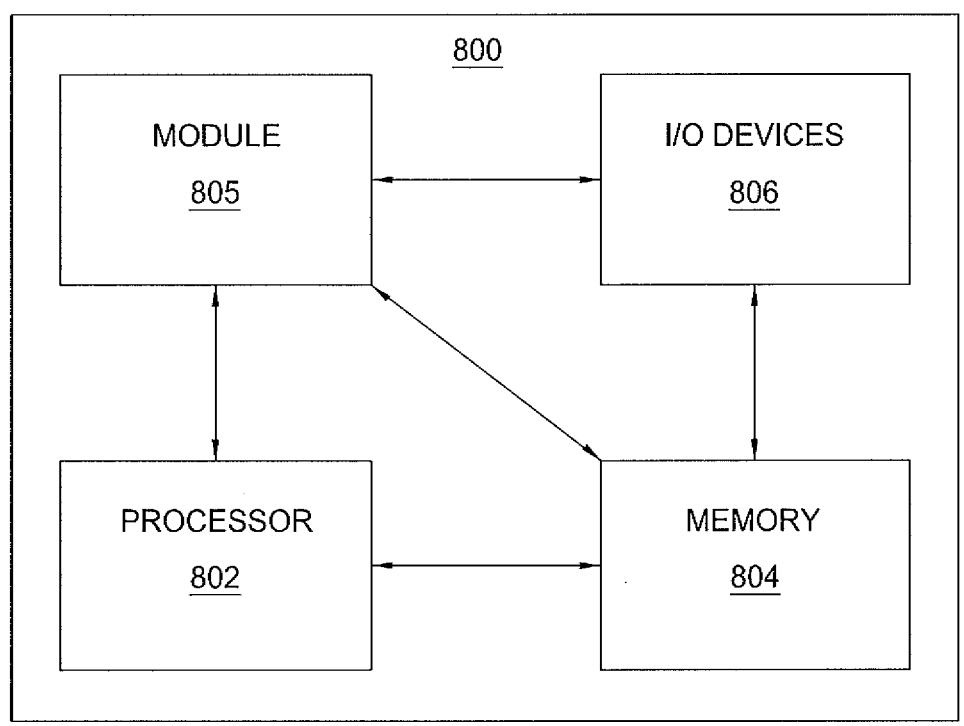
FIG. 8 illustrates a high-level block diagram of a general-purpose computing and/or manufacturing system suitable for use in performing the functions described herein.

FIG. 8 depicts a high-level block diagram of a general-purpose computing and/or manufacturing system suitable for use in performing the functions described herein. As depicted in FIG. 8, the system 800 comprises a processor element 802 (e.g., a CPU), a memory 804, e.g., random access memory (RAM) and/or read only memory (ROM), a module 805 for producing the VECLA diode laser having cross-over metallization, and/or for executing a method optimization for a diode laser, and various input/output devices 806 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, alarm interfaces, power relays, various sensors, various measuring devices, substrate processing equipment, diode laser manufacturing devices, semiconductor processing chambers, and the like)).

It should be noted that the method and apparatus of the current disclosure can be implemented in a combination of software and hardware, e.g., using application specific integrated circuits (ASIC), a general-purpose computer or any other hardware equivalents. In one embodiment, one or more steps of the present module or process 805 for producing the VECLA diode laser having cross-over metallization, and/or for executing a method optimization for a diode laser can be loaded into memory 804 and executed by processor 802 to implement the functions as discussed above. As such, the present method for producing the VECLA diode laser having cross-over metallization, and/or for executing a method optimization for a diode laser (including associated data structures) of the present disclosure can be stored on a non-transistory computer readable storage medium, e.g., RAM memory, magnetic or optical drive or diskette and the like.

Although various embodiments which incorporate the teachings of the present invention have been shown and described in detail herein, those skilled in the art can readily devise many other varied embodiments that still incorporate these teachings.

What is claimed is:

1. A diode laser, comprising:
   a passive pedestal layer structure, wherein the passive pedestal layer structure comprises:
      a passive waveguide layer;
      a cladding layer coupled optically to the passive waveguide layer;
      a spoiler layer coupled to the cladding layer;
      a sub-graded index (GRIN) layer coupled to the spoiler layer; and
      a substrate layer coupled to the sub-GRIN layer;
   an active ridge layer structure positioned over the passive pedestal layer structure;
   a p-contact metal contacting a top side of the active ridge layer structure;
   a first n-contact metal disposed on a first side of the active ridge layer structure;
   a second n-contact metal disposed on a second side of the active ridge layer structure; and
   an n-final-metal layer connecting the first n-contact metal and the second n-contact metal, wherein the n-final-metal layer is continuous over the active ridge layer structure.

2. The diode laser of claim 1, wherein the passive waveguide layer is undoped and comprises an aluminum gallium arsenide alloy.

3. The diode laser of claim 1, wherein the substrate layer comprises a gallium (Ga) arsenide (As) substrate.

4. The diode laser of claim 1, wherein a height of the active ridge layer structure is approximately 1 micron (μm).

5. The diode laser of claim 1, wherein the first n-contact metal, the second n-contact metal and the n-final-metal layer comprise a palladium (Pd) germanium (Ge) metal.

6. The diode laser of claim 1, wherein the p-contact metal comprises a titanium (Ti) platinum (Pt) gold (Au) metal.

7. A diode laser, comprising:
a passive pedestal layer structure;
an active ridge layer structure positioned over the passive pedestal layer structure, wherein the active ridge layer structure comprises a graded-index separate confined heterostructure (GRINSCH) comprising an 20% to 40% compositional grading of aluminum mole fraction;
a p-contact metal contacting a top side of the active ridge layer structure;
a first n-contact metal disposed on a first side of the active ridge layer structure;
a second n-contact metal disposed on a second side of the active ridge layer structure; and
an n-final-metal layer connecting the first n-contact metal and the second n-contact metal, wherein the n-final-metal layer is continuous over the active ridge layer structure.

8. The diode laser of claim 7, wherein the active ridge layer structure further comprises:
a compressively strained indium (In) gallium (Ga) arsenic (As) quantum well; and
a GaAs barrier layer coupled to each side of the InGaAs quantum well, for surrounding the InGaAs quantum well.

* * * * *